US008421345B2

(12) United States Patent
Kim

(10) Patent No.: US 8,421,345 B2
(45) Date of Patent: Apr. 16, 2013

(54) ELECTROLUMINESCENT DEVICE INCLUDING WHITE COLOR FILTER PATTERN HAVING BLUE LIGHT TRANSMITTANCE GREATER THAN RED AND GREEN LIGHT TRANSMITTANCE

(75) Inventor: Hwa-Kyung Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 13/192,316

(22) Filed: Jul. 27, 2011

(65) Prior Publication Data

US 2012/0032583 A1 Feb. 9, 2012

(30) Foreign Application Priority Data

Aug. 3, 2010 (KR) .................. 10-2010-0075112
Aug. 17, 2010 (KR) .................. 10-2010-0079404

(51) Int. Cl.
*H05B 33/00* (2006.01)
*H05B 33/26* (2006.01)
*H01J 1/62* (2006.01)

(52) U.S. Cl.
USPC ............ 313/504; 313/506; 428/690; 428/917

(58) Field of Classification Search ........... 313/504–506
See application file for complete search history.

(56) References Cited

U.S. PATENT DOCUMENTS

| 8,022,620 | B2 * | 9/2011 | Kobayashi | 313/506 |
| 8,054,419 | B2 * | 11/2011 | Liu et al. | 349/106 |
| 2004/0189167 | A1 * | 9/2004 | Adachi et al. | 313/112 |
| 2005/0147844 | A1 * | 7/2005 | Hatwar et al. | 428/690 |
| 2005/0218768 | A1 | 10/2005 | Saito | |
| 2007/0007515 | A1 * | 1/2007 | Suh et al. | 257/40 |
| 2009/0072693 | A1 | 3/2009 | Cok et al. | |
| 2010/0171910 | A1 | 7/2010 | Liu et al. | |
| 2010/0277677 | A1 * | 11/2010 | Nakamura et al. | 349/106 |

* cited by examiner

*Primary Examiner* — Sikha Roy
(74) *Attorney, Agent, or Firm* — Birch, Stewart, Kolasch & Birch, LLP

(57) ABSTRACT

An organic electroluminescent device includes a first substrate including first to fourth pixel regions; an organic electroluminescent diode on the first substrate and in each of the first to fourth pixel regions, the organic electroluminescent diode emitting a white light; a second substrate facing the first substrate; and a color filter layer positioned between the organic electroluminescent diode and the second substrate or between the organic electroluminescent diode and the first substrate and including a red color filter pattern, a green color filter pattern, a blue color filter pattern and a white color filter pattern corresponding to the first to fourth pixel regions, respectively, wherein the white color filter pattern has a first transmittance with respect to a blue light greater than a second transmittance with respect to a red light and a green light.

9 Claims, 4 Drawing Sheets

ELECTROLUMINESCENT DEVICE INCLUDING WHITE COLOR FILTER PATTERN HAVING BLUE LIGHT TRANSMITTANCE GREATER THAN RED AND GREEN LIGHT TRANSMITTANCE

The present application claims the priority benefit of Korean Patent Application Nos. 10-2010-0075112 and 10-2010-0079404, filed in Republic of Korea on Aug. 3, 2010 and Aug. 17, 2010, respectively, both of which are herein incorporated by reference.

BACKGROUND

1. Technical Field

The present invention relates to an organic electroluminescent device (OELD), more particularly, to an OELD having reduced consumption power and improved ambient contrast ratio.

2. Related Art

An OELD of new flat panel display devices is a self-emitting type. The OELD has excellent characteristics of a view angel, a contrast ratio and so on. Also, since the OELD does not require a backlight assembly, the OELD has low weight and low power consumption. Moreover, the OELD has advantages of a high response rate, a low production cost and so on.

The OELD may be classified into a passive matrix type and an active matrix type.

In the passive matrix type OELD, anodes are arranged perpendicular to cathodes. The intersection of the cathode and anode make up the pixel where light is emitted. External circuitry applies current to selected strips of anode and cathode such that one pixel is turned on and other pixels are turned off. The brightness of each pixel is proportional to the amount of applied current. The passive matrix type OELD is easy to make, but more power is required.

In the active matrix type OELD, a thin film transistor (TFT) as a switching element is positioned in each pixel. A first electrode, which is connected to the TFT, is turned on and off in each pixel, and a second electrode facing the first electrode serves as a common electrode. In addition, an applied voltage is charged in a storage capacitor, the voltage is maintained by next frame. Accordingly, the active matrix type OELD requires a lower power, so it is efficient for large display devices.

FIG. 1 is a circuit diagram showing a pixel region of the related art OELD. As shown in FIG. 1, a gate line "GL", a data line "DL", a power supply line "PL", a switching thin film transistor (TFT) "STr", a storage capacitor "StgC", a driving TFT "DTr", and an organic electroluminescent diode "E" are formed in one pixel region "P". The gate line "GL" and the data line "DL" cross each other such that the pixel region "P" is defined, and the power supply line "PL" is formed to be parallel to the data line "DL". The switching TFT "STr" is fanned at crossing portion of the gate and data line "GL" and "DL". The driving TFT "DTr" is electrically connected to the switching TFT "STr".

The driving TFT "DTr" is electrically connected to the organic electroluminescent diode "E". In more detail, a first electrode of the organic electroluminescent diode "E" is connected to a drain electrode of the driving TFT "DTr", and a second electrode of the organic electroluminescent diode "E" is connected to the power supply line "PL". The power supply line "PL" provides a source voltage to the organic electroluminescent diode "E". The storage capacitor "Cst" is disposed between gate and source electrodes of the driving TFT "Tr".

When a signal is applied to the switching TFT "STr" through the gate line "GL" such that the switching TFT "STr" is turned on, a signal from the data line "DL" is applied to the gate electrode of the driving TFT "DTr" such that the driving TFT "DTr" is turned on. As a result, light is emitted from the organic electroluminescent diode "E". In this case, when the driving TFT "DTr" is turned on, a level of an electric current applied from the power supply line "PL" to the organic electroluminescent diode "E" is determined such that the organic electroluminescent diode "E" can produce a gray scale. The storage capacitor "StgC" serves as maintaining the voltage of the gate electrode of the driving TFT "DTr" when the switching TFT "STr" is turned off. Accordingly, even if the switching TFT "STr" is turned off, a level of an electric current applied from the power supply line "PL" to the organic electroluminescent diode "E" is maintained to next frame.

An organic emitting layer of the OELD may include organic emitting materials for emitting red, green and blue colors. Alternatively, the organic emitting layer may include an organic emitting material for emitting a white light, and red, green and blue color filter patterns are formed in each pixel.

Recently, to increase brightness and reduce power consumption, an OELD displaying a color image using a white pixel with red, green and blue pixels is introduced.

On the other hand, to improve an ambient contrast ration (ACR) of the display device, a circular polarizer is positioned at outmost side of the display device. Unfortunately, the circular polarizer causes an increase of power consumption.

To prevent the increase of power consumption, the color filter patterns are used for increasing the ambient contrast ratio. However, there is a limitation in increasing the ambient contrast ratio because there is no color filter pattern in the white pixel. In more detail, the OELD including a white organic emitting layer uses color filters to display a color image. In the OELD is intended to increase the ambient contrast ratio without the circular polarizer. However, since there is no color filter pattern in the white pixel, there is bad effect on the ambient contrast ratio. On the other hand, the OELD including the red, green and blue color filter patterns without the white pixel has an advantage in the ambient contrast ratio but has a disadvantage in power consumption.

Generally, in the OELD including red, green, blue and white pixels, power consumption is reduced when a color coordinate of a device displaying a white light is equal to a reference color coordinate of a panel. In general, since a color coordinate of a device displaying a white light is less than a reference color coordinate of a panel, the reference color coordinate becomes less by driving the blue pixel, which has less transmittance. In this case, since the blue pixel is also driven with the white pixel, power consumption is increased.

SUMMARY

Accordingly, the present invention is directed to an OELD that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic electroluminescent device includes a first substrate including first to fourth pixel regions; an organic electroluminescent diode on the first substrate and in each of the first to fourth pixel regions, the organic electroluminescent diode emitting a white light; a second substrate facing the first substrate; and a color filter layer positioned between the organic electroluminescent diode and the second substrate or between the organic electroluminescent diode and the first substrate and including a red color filter pattern, a green color filter pattern, a blue color filter pattern and a white color filter pattern corresponding to the first to fourth pixel regions, respectively, wherein the white color filter pattern has a first transmittance with respect to a blue light greater than a second transmittance with respect to a red light and a green light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 1:
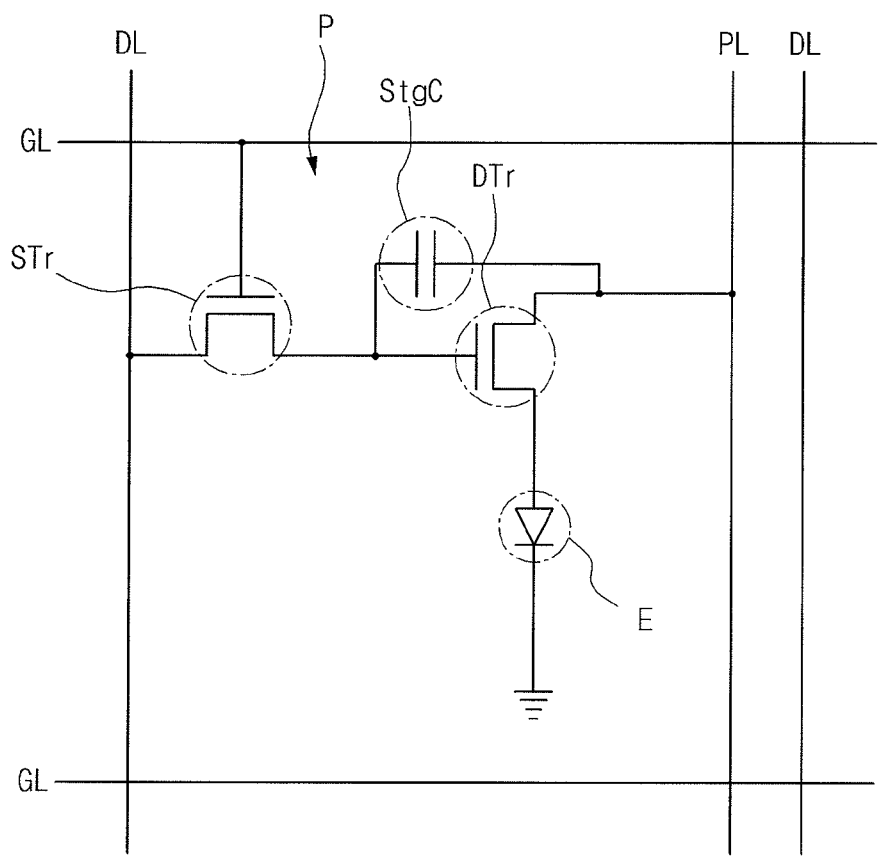
FIG. 1 is a circuit diagram showing a pixel region of the related art OELD.
Figure 2:
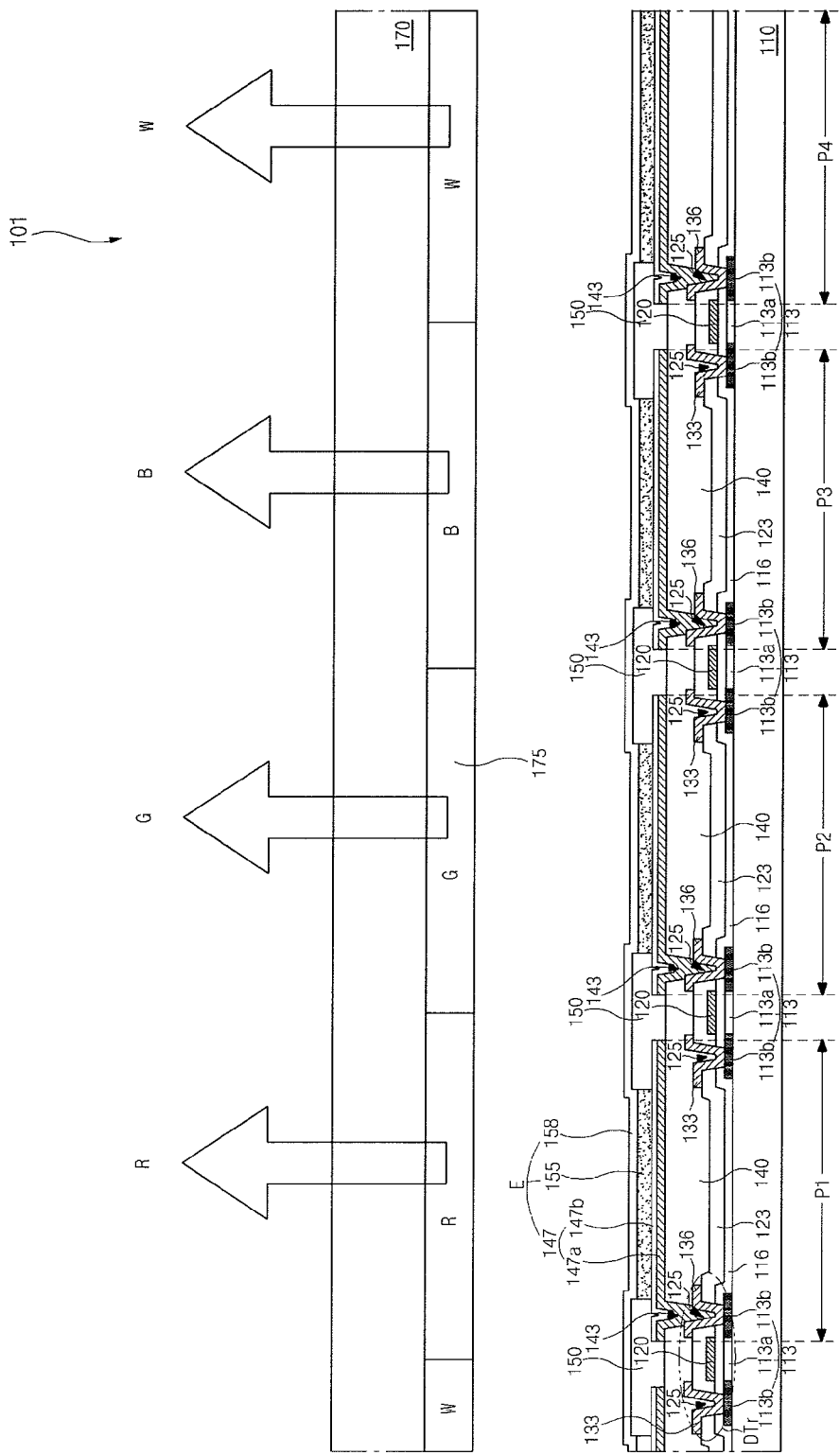
FIG. 2 is a schematic cross-sectional view showing red, green, blue and white pixel regions of an OELD according to the present invention.

FIG. 2 is a schematic cross-sectional view showing red, green, blue and white pixel regions of an OELD according to the present invention. For convenience of explanation, a switching region, where a switching thin film transistor (TFT) is formed, and a driving region, where a driving TFT is formed, are defined.

As shown in FIG. 2, an OELD 101 according to the present invention includes a first substrate 110, a switching TFT (not shown), a driving TFT DTr, an organic electroluminescent diode E, a second substrate 170, which faces the first substrate 110, and a color filter layer 175. The switching TFT (not shown), the driving TFT DTr and the organic electroluminescent diode E are positioned on the first substrate 110, and the color filter layer 175 is positioned on the second substrate 170. The color filter layer 175 includes a red color filter pattern R, a green color filter pattern G, a blue color filter pattern B and a white color filter pattern W.

On the first substrate 110, a first semiconductor layer 113 including a first region 113a as a channel and second regions 113b at both sides of the first region 113a are formed in the driving region DA. The first region 113a is formed of intrinsic polycrystalline silicon, and high impurities are doped in the second regions 113b. Although not shown, a buffer layer, which is formed of an inorganic insulating material, such as silicon oxide and silicon nitride, may be formed between the first substrate 110 and the first semiconductor layer 113. Due to the buffer layer, property degradation of the semiconductor layer 113 by alkali ions from the first substrate 110 during a crystallization process of the semiconductor layer 113 is prevented.

Although not shown, a second semiconductor layer including a third region as a channel and fourth regions at both sides of the third region is formed in the switching region.

A gate insulating layer 116 is formed on the first semiconductor layer 113 and the second semiconductor layer, and a first gate electrode 120 is formed on the gate insulating layer 116. The first gate electrode 120 corresponding to the first region 113a of the first semiconductor layer 113. Namely, the first gate electrode 120 overlaps the first region 113a. Although not shown, a second gate electrode corresponding to the third region of the second semiconductor layer is formed on the gate insulating layer 116.

A gate line (not shown) connected to the second gate electrode is also formed on the gate insulating layer 116.

An interlayer insulating layer 123 is formed on the first gate electrode 120, the second gate electrode and the gate line. The interlayer insulating layer 123 and the gate insulating layer 116 are patterned to form first semiconductor contact holes 125 respectively exposing the second regions 113b of the first semiconductor layer 113. Although not shown, second semiconductor contact holes respectively exposing the fourth regions of the second semiconductor layer are formed thorough the interlayer insulating layer 123 and the gate insulating layer 116.

On the interlayer insulating layer 123, a first source electrode 133 and a first drain electrode 136 are formed. The first source electrode 133 and the first drain electrode 136 respectively contact the second regions 113b through the first semiconductor contact holes 125. Although not shown, a second source electrode and a second drain electrode are formed on the interlayer insulating layer 123. The second source electrode and the second drain electrode respectively contact the fourth regions through the second semiconductor contact holes. In addition, a data line and a power line are formed on the interlayer insulating layer 123. The data line crosses the gate line to define first to fourth pixel regions P1, P2, P3 and P4. The data line is connected to the second source electrode in the switching region, and the power line is connected to the first source electrode in the driving region.

The first semiconductor layer 113, the first gate electrode 120, the first source electrode 133 and the first drain electrode 136 constitute the driving TFT DTr. In addition, the second semiconductor layer, the second gate electrode, the second source electrode and the second drain electrode constitute the switching TFT. The switching TFT is electrically connected to the driving TFT DTr, the gate line and the data line.

The switching TFT and the driving TFT DTr are classified into a p-type or an n-type TFT depending on a doped impurity. For example, a trivalent atom such as boron is doped into the second regions 113b to form the p-type TFT. In the p-type TFT, a hole is used as a carrier.

On the other hand, a first electrode 147 of the organic electroluminescent diode E serves as an anode or a cathode depending on a type of the driving TFT DTr. In the present invention, the driving TFT DTr is the p-type such that the first electrode 147 serves as the anode.

FIG. 2 shows the driving TFT DTr being as a top gate type and including the semiconductor layer of polycrystalline silicon. Alternatively, each of the driving TFT DTr and the switching TFT may be a bottom gate type and include the semiconductor layers of amorphous silicon. In the bottom gate type TFTs, the gate electrode, the gate insulating layer, the semiconductor layer including an active layer of intrinsic amorphous silicon and an ohmic contact layer of impurity-doped silicon are sequentially stacked, and the source electrode and the drain electrode are positioned on the semiconductor layer. The gate line is positioned at the same layer as the gate electrode, and the data line is positioned at the same layer as the source electrode. The gate line is connected to the gate electrode of the switching TFT, and the data line is connected to the source electrode of the switching TFT.

On the switching TFT and the driving TFT DTr, a passivation layer 140 is formed. The passivation layer 140 has a drain contact hole 143 exposing the first drain electrode 136 of the driving TFT DTr.

On the passivation layer 140, the first electrode 147 is formed in each of the first to fourth pixel regions P1, P2, P3 and P4. The first electrode 147 contacts the first drain electrode 136 of the driving TFT DTr through the drain contact hole 143. In the present invention, the first electrode 147 has a double-layered structure. A lower layer 147a serves as a reflection plate, and an upper layer 147b serves as an anode. The upper layer 147b is formed of a transparent conductive material such as indium-tin-oxide (ITO) and indium-zinc-oxide (IZO). Since the transparent conductive material has a relatively high work function such that the upper layer 147b serves as the anode. The lower layer 147a is formed of a relative high reflection efficiency material such as aluminum (Al) and silver (Ag) to reflect light toward the second substrate 170.

A buffer pattern 150 corresponding to edges of the first electrode 147 is formed. Namely, the buffer pattern 150 surrounds each of the first to fourth pixel regions P1, P2, P3 and P4. For example, the buffer pattern 150 may be formed of an organic insulating material such as polyimide, photo-acryl and benzocyclobutene (BCB). Alternatively, the buffer pattern 150 may be formed of a black resin.

In each of the first to fourth pixel regions P1, P2, P3 and P4, an organic emitting layer 155 is formed on the first electrode 147. The organic emitting layer 155 emits white light and is surrounded by the buffer pattern 150. In addition, a second electrode 158 covering an entire display area of the first substrate 110 is formed on the organic emitting layer 155. The first electrode 147, the organic emitting layer 155 and the second electrode 158 constitute the organic electroluminescent diode E.

Although not shown, to increase an emitting efficiency of the organic emitting layer 155, a first emission-compensation layer and a second emission-compensation layer may be formed between the first electrode 147 and the organic emitting layer 155 and between the second electrode 158 and the organic emitting layer 155, respectively. The first emission-compensation layer includes a hole injection layer and a hole transporting layer, and the second emission-compensation layer includes an electron transporting layer and an electron injection layer. Each of the first and second emission-compensation layers may cover an entire display area of the first substrate or may be positioned in each of the first to fourth pixel regions P1, P2, P3 and P4.

The second electrode 158 is formed of a relatively low work function material such as Al, Al alloy, Ag, magnesium (Mg), gold (Au) and Al—Mg alloy (AlMg) to serve as a cathode. The second electrode 158 has a thickness of about 10 to 200 angstroms such that light from the organic emitting layer 155 passes through the second electrode 158.

As mentioned above, the first electrode 147 and the second electrode 158 respectively serve as the anode and the cathode. Alternatively, the first electrode 147 may be formed of a relatively low work function material to serve as a cathode, and the second electrode 158 may be formed of a relatively high work function material to serve as an anode.

On the second substrate 170, the color filter layer 175 is formed. The color filter layer 175 includes the red color filter pattern R as a first color filter pattern, the green color filter pattern G as a second color filter pattern and the blue color filter pattern B as a fourth color filter pattern corresponding to the first to third pixel regions P1, P2 and P3, respectively. In addition, the color filter layer 175 further includes a white color filter pattern W as a fourth color filter pattern corresponding to the fourth pixel region P4. The white color filter pattern W emits bluish-white light. Although not shown, an overcoat layer may be formed on the color filter layer 175.

Generally, a white color filter pattern is formed of a transparent resin having substantially the same transmittance of 30 to 35% with respect to the red light, the green light and the blue light.

However, in the OELD 101 according to the present invention, the white color filter pattern W has a blue light transmittance greater than each of a red light transmittance and a green light transmittance. Namely, the white color filter pattern W is formed of a transparent resin having a first transmittance of about 50 to 99% to a wavelength of 450 to 550 nm, i.e., a blue light, and a second transmittance of about 10 to 90% to a wavelength of 550 to 780 nm, i.e., a red light or a green light. Since the white color filter pattern W has the first transmittance to the blue light being greater than the second transmittance to the red light and/or the green light, the white color filter pattern W emits the bluish-white light. Due to the white color filter pattern W, which emits the bluish-white light, in the fourth pixel region P4, the ambient contrast ratio is increase.

Generally, an efficiency of a white device is maximized when an efficiency of each of red, green and blue devices is maximized. However, since an efficiency of the blue device is smaller than that of the red and green devices, there is a limitation in increasing a color temperature of the white device, e.g., 5000 to 8000 K. In addition, in order that the white device meets a color temperature above 9000K, which is required in the general display device, the red, green and blue pixel regions should be driven with the white pixel region.

On the other hand, since the white pixel region has an emitting efficiency greater than the red, green and blue pixel regions, power consumption of the panel can be reduced when the color temperature of the white pixel region is adjusted to the reference color temperature of the panel.

In the present invention, by forming the white color filter pattern W, which emits the bluish-white light and provides a desired color temperature, in the fourth pixel region P4, power consumption of the OELD is reduced. In addition, by reducing an ambient light reflection in the fourth pixel region P4, an ambient contrast ratio is improved. Moreover, since the ambient contrast ratio is controlled by the white color filter pattern W, there is the degree of the freedom in the ambient contrast ratio.

The white color filter pattern W includes a dye of a weight % of about 0.1 to 15. The dye is a blue color dye or a mixture of the blue color dye and a purple color dye.

Figure 3:
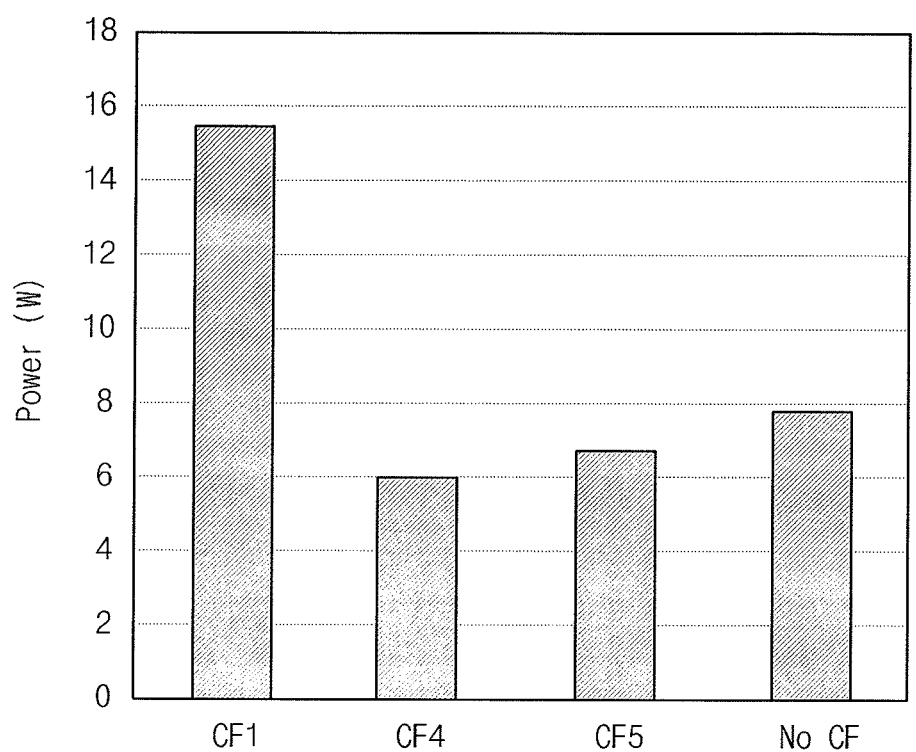
FIG. 3 is a graph showing power consumption in OELDs.

FIG. 3 is a graph showing power consumption in OELDs. In FIG. 3, "CF1" is a graph in an OELD including a white color filter pattern only transmitting a blue light, and "CF4" is a graph in an OELD including a white color filter pattern in the present invention. "CF5" is a graph in an OELD including a white color filter pattern having substantially the same transmittance with respect to the red, green and blue lights, and "No CF" is a graph in an OELD without a white color filter pattern. FIG. 3 shows power consumption of the panel when an image having a color temperature of 9000 K and a brightness of about 200 nit.

As shown in FIG. 3, the OELD "CF4" in the present invention having the white color filter pattern, which has a blue light transmittance greater than each of a red light transmittance and a green light transmittance, has the power consumption of about 5.9 W. On the other hand, the OELD "No CF" without the white color filter pattern has the power consumption of about 7.74 W, an the OELD "CF5" has the power consumption of about 6.72 W. The OELD "CF1" has the power consumption of about 15.45 W. Namely, the OELD according to the present invention has an advantage in power consumption with the same condition.

Figure 4:
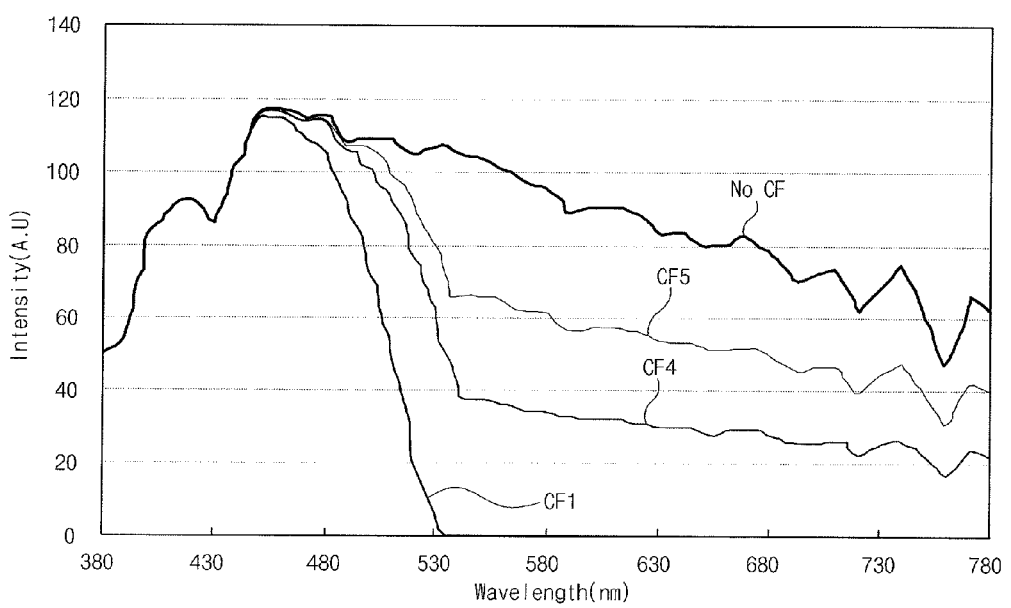
FIG. 4 is a graph showing an external light reflection in OELDs.

FIG. 4 is a graph showing an external light reflection in OELDs. As shown in FIG. 4, the external light reflection has smallest intensity in the OELD "CF1" and largest intensity in the OELD "No CF". The OELD "CF4" in the present invention has larger external light reflection intensity than the OELD "CF1" and smaller external light reflection intensity than the OELD "No CF" and the OELD "CF5". The external light reflection intensity of the OELD "CF4" in the present invention is about half of that of the OELD "No CF". Namely, the external light reflection is relatively decreased in the OELD of the present invention such that the ambient contrast ratio is relatively increased.

Referring to FIGS. 3 and 4, the OELD in the present invention has advantages in the power consumption and the ambient contrast ratio with compared to other OELDs.

Referring back to FIG. 2, a seal pattern or a frit pattern (not shown) as a bonding element is formed along an edge of the first substrate 110 or the second substrate 170 such that the first and second substrates 110 and 170 are attached to each other under a condition of vacuum or an inert gas.

Although not shown, a circular polarizer may be further formed on an outer side of the second substrate 170 to further improve the ambient contrast ratio. Even though the power consumption is increased with the circular, the power consumption in the OELD of the present invention is still lower than other OELDs because the power consumption is lowest as shown in FIG. 3. With the circular polarizer, the buffer pattern 150 may be formed of a transparent organic material. On the other hand, without the circular polarizer, the buffer pattern 150 may be formed of a black resin for the ambient contrast ratio.

FIG. 2 shows a top emission type OELD where the color filter layer 175 is formed between the organic electroluminescent diode E and the second substrate 170. Alternatively, the color filter layer 175 may be formed between the first substrate and the organic electroluminescent diode E to obtain a bottom emission type OELD. In this case, the circular polarizer is positioned on an outer side of the first substrate such that the color filter layer 175 is positioned between the circular polarizer and the organic electroluminescent diode "E".

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a first substrate including first to fourth pixel regions;
   an organic electroluminescent diode on the first substrate and in each of the first to fourth pixel regions, the organic electroluminescent diode emitting a white light;
   a second substrate facing the first substrate; and
   a color filter layer positioned between the organic electroluminescent diode and the second substrate or between the organic electroluminescent diode and the first substrate and including a red color filter pattern, a green color filter pattern, a blue color filter pattern and a white color filter pattern corresponding to the first to fourth pixel regions, respectively,
   wherein the white color filter pattern has a first transmittance with respect to a blue light, a second transmittance with respect to a red light and a third transmittance with respect to a green light, and wherein the first transmittance is greater than the second and third transmittance, and the second transmittance is substantially equal to the third transmittance.

2. The device according to claim 1, wherein the first transmittance has a range of about 50 to 99%, and the second transmittance has a range of about 10 to 90%.

3. The device according to claim 1, further comprising:
   a switching thin film transistor in each of the first to fourth pixel regions;
   a driving thin film transistor in each of the first to fourth pixel regions and connected to the switching thin film transistor;
   a gate line and a data line crossing each other and electrically connected to the switching thin film transistor; and
   a power line electrically connected to the driving thin film transistor.

4. The device according to claim 3, wherein the organic electroluminescent diode includes a first electrode, a second electrode and an organic emitting layer between the first and second electrodes, and the first electrode is connected to the driving thin film transistor.

5. The device according to claim 4, further comprising a buffer pattern surrounding the organic emitting layer.

6. The device according to claim 5, wherein the buffer pattern is formed of a transparent organic insulating material or a black resin.

7. The device according to claim 1, further comprising a circular polarizer between on an outer side of the first substrate or the second substrate such that the color filter layer is positioned between the circular polarizer and the organic electroluminescent diode.

8. The device according to claim 1, wherein the white color filter layer includes a dye having a weight % of about 0.1 to 15.

9. The device according to claim 8, wherein the dye is a blue color dye or a mixture of the blue color dye and a purple color dye.

* * * * *

UNITED STATES PATENT AND TRADEMARK OFFICE
CERTIFICATE OF CORRECTION

| | |
|---|---|
| PATENT NO. | : 8,421,345 B2 |
| APPLICATION NO. | : 13/192316 |
| DATED | : April 16, 2013 |
| INVENTOR(S) | : Hwa-Kyung Kim |

It is certified that error appears in the above-identified patent and that said Letters Patent is hereby corrected as shown below:

Title Page, Item (54) and in the specification, Col. 1, Lines 1-5, Title should read:

--ORGANIC ELECTROLUMINESCENT DEVICE INCLUDING WHITE COLOR FILTER PATTERN HAVING BLUE LIGHT TRANSMITTANCE GREATER THAN RED AND GREEN LIGHT TRANSMITTANCE--

Signed and Sealed this
Fourteenth Day of May, 2013

Teresa Stanek Rea
*Acting Director of the United States Patent and Trademark Office*